(12) United States Patent
Feng et al.

(10) Patent No.: US 10,998,446 B2
(45) Date of Patent: May 4, 2021

(54) ARRAY SUBSTRATE, MANUFACTURING METHOD THEREOF, AND DISPLAY PANEL

(71) Applicants: Hefei Xinsheng Optoelectronics Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/395,444

(22) Filed: Apr. 26, 2019

(65) Prior Publication Data
US 2020/0044092 A1 Feb. 6, 2020

(30) Foreign Application Priority Data
Aug. 1, 2018 (CN) .......................... 201810863664.9

(51) Int. Cl.
*H01L 29/786* (2006.01)
*G09G 3/36* (2006.01)
(Continued)

(52) U.S. Cl.
CPC ..... *H01L 29/78633* (2013.01); *G09G 3/3677* (2013.01); *H01L 27/1225* (2013.01);
(Continued)

(58) Field of Classification Search
None
See application file for complete search history.

(56) References Cited

U.S. PATENT DOCUMENTS

2004/0109098 A1* 6/2004 Kim ................. G02F 1/133514
349/38
2015/0048349 A1* 2/2015 Kawata ................. H01L 27/323
257/40

(Continued)

FOREIGN PATENT DOCUMENTS

CN 103579356 A 2/2014
CN 104393024 A 3/2015
(Continued)

OTHER PUBLICATIONS

May 7, 2020—(CN) First Office Action Appn 201810863664.9 with English Translation.

*Primary Examiner* — Krishna P Neupane
(74) *Attorney, Agent, or Firm* — Banner & Witcoff, Ltd.

(57) ABSTRACT

An array substrate, a manufacturing method thereof and a display panel are provided. The array substrate includes a base substrate, a plurality of thin film transistors and a first light shielding layer. The base substrate includes a first surface and a second surface respectively located on opposite sides of the base substrate. The plurality of thin film transistors are disposed on the first surface of the base substrate, and each of the plurality of thin film transistors includes an active layer. The first light shielding layer is disposed on the second surface of the base substrate. The first light shielding layer has at least one opening that overlaps with at least one thin film transistor in a direction perpendicular to the second surface of the base substrate to allow light to irradiate at least the active layer of at least one thin film transistor.

16 Claims, 4 Drawing Sheets

(51) Int. Cl.
*H01L 27/12* (2006.01)
*H01L 29/66* (2006.01)
*G02F 1/1335* (2006.01)
*G02F 1/1362* (2006.01)
*G02F 1/1368* (2006.01)
*G11C 19/28* (2006.01)

(52) U.S. Cl.
CPC ...... *H01L 27/1251* (2013.01); *H01L 27/1292* (2013.01); *H01L 29/66757* (2013.01); *H01L 29/66969* (2013.01); *H01L 29/7869* (2013.01); *H01L 29/78675* (2013.01); *G02F 1/1368* (2013.01); *G02F 1/13685* (2021.01); *G02F 1/133528* (2013.01); *G02F 1/136209* (2013.01); *G09G 2310/0286* (2013.01); *G09G 2310/08* (2013.01); *G09G 2320/043* (2013.01); *G11C 19/287* (2013.01)

(56) References Cited

U.S. PATENT DOCUMENTS

| | | | |
|---|---|---|---|
| 2016/0202534 A1* | 7/2016 | Chen | G02F 1/13454 349/43 |
| 2018/0095315 A1* | 4/2018 | Yoon | G02F 1/13306 |
| 2018/0188563 A1* | 7/2018 | Yao | G02F 1/1336 |
| 2018/0277685 A1* | 9/2018 | Chen | H01L 29/66969 |
| 2018/0294360 A1 | 10/2018 | Zhang et al. | |
| 2019/0006395 A1 | 1/2019 | Wei et al. | |
| 2019/0171308 A1* | 6/2019 | Chang | G06F 3/041 |
| 2019/0207038 A1 | 7/2019 | Sun | |

FOREIGN PATENT DOCUMENTS

| | | | |
|---|---|---|---|
| CN | 104393024 | * 4/2015 | ............ H01L 27/32 |
| CN | 106981478 A | 7/2017 | |
| CN | 107275347 A | 10/2017 | |
| CN | 107302032 A | 10/2017 | |
| CN | 107885001 A | 4/2018 | |

* cited by examiner

ARRAY SUBSTRATE, MANUFACTURING METHOD THEREOF, AND DISPLAY PANEL

CROSS REFERENCE TO RELATED APPLICATIONS

The present application claims priority of Chinese Patent Application No. 201810863664.9 filed on Aug. 1, 2018, the disclosure of which is incorporated herein by reference in its entirety as part of the present application.

TECHNICAL FIELD

The embodiment of the disclosure relates to an array substrate, a manufacturing method thereof and a display panel.

BACKGROUND

In the field of display technology, a pixel array of an Organic Light Emitting Diode, OLED) display panel, for example, usually includes a plurality of rows of gate lines and a plurality of columns of data lines intersected therewith. The gate lines can be driven by a bonded integrated drive circuit. In recent years, with the continuous improvement of the preparation technology of amorphous silicon thin film transistors or oxide thin film transistors, the gate drive circuit can also be directly integrated on an array substrate to form GOA (Gate driver On Array) to drive the gate lines. For example, GOA composed of a plurality of cascaded shift register units can be used to provide switching state voltage signals for multiple rows of gate lines of a pixel array, so as to control the multiple rows of gate lines to be sequentially turned on, for example, and simultaneously provide data signals to pixel units of corresponding rows in the pixel array from data lines to form gray scale voltages required for each gray scale of a display image in each pixel unit, so that a frame of image is displayed.

SUMMARY

At least one embodiment of the present disclosure an array substrate comprising: a base substrate including a first surface and a second surface respectively at opposite sides of the base substrate; a plurality of thin film transistors provided on the first surface of the base substrate, each of the plurality of thin film transistors including an active layer; and a first light shielding layer provided on the second surface of the base substrate. The first light shielding layer has at least one opening that overlaps with at least one thin film transistor in a direction perpendicular to the second surface of the base substrate to allow light to irradiate the active layer of at least one thin film transistor.

For example, the array substrate further comprises a gate drive circuit on the first surface of the base substrate, the gate drive circuit comprising the plurality of thin film transistors.

For example, the base substrate comprises a border region, and the gate drive circuit and the first light shielding layer are provided in the border region.

For example, the at least one thin film transistor is a top-gate type thin film transistor.

For example, the array substrate further comprises a second light shielding layer. The second light shielding layer is provided on the first surface of the base substrate and is between the base substrate and active layers of the thin film transistors that do not overlap with the opening.

For example, the gate drive circuit comprises a plurality of cascaded shift register units, each of which comprises an input circuit, an output circuit, a pull-up node, a pull-down node and a pull-down circuit, the input circuit being configured to charge the pull-up node in response to an input signal, the output circuit being configured to output a clock signal to an output terminal under the control of a level of the pull-up node, and the pull-down circuit being configured to de-noise the pull-up node and the output terminal under the control of a level of the pull-down node.

For example, the pull-down circuit comprises a first transistor and a second transistor, a gate electrode of the first transistor being configured to be connected to the pull-down node, a first pole of the first transistor being configured to be connected to the pull-up node, and a second pole of the first transistor being configured to be connected to a first voltage terminal to receive a first voltage, a gate electrode of the second transistor being configured to be connected to the pull-down node, a first pole of the second transistor being configured to be connected to the output terminal, and a second pole of the second transistor being configured to be connected to the first voltage terminal to receive the first voltage, and the opening overlapping with the first transistor and the second transistor in a direction perpendicular to the second surface of the base substrate to allow light to irradiate at least active layers of the first transistor and the second transistor.

For example, the base substrate is a transparent substrate.

For example, the array substrate further comprises a buffer layer. The buffer layer is provided on the first surface of the base substrate and between the base substrate and the active layer of the at least one thin film transistor.

For example, the buffer layer is made of transparent material.

For example, the array substrate further comprises a polarizer. The polarizer is arranged on the second surface of the base substrate and is provided between the base substrate and the first light shielding layer.

For example, material of the first light shielding layer is selected from the group consisting of chromium, chromium oxide or black resin.

At least one embodiment of the present disclosure also provides a display panel comprising the array substrate.

For example, the display panel further comprises a backlight source. Light emitted from the backlight source is irradiated to the active layer of the at least one thin film transistor through the opening.

At least one embodiment of the present disclosure also provides a manufacturing method of an array substrate, comprising: forming a plurality of thin film transistors on a first surface of a base substrate, each of the plurality of thin film transistors including an active layer; forming a first light shielding layer on a second surface of the base substrate. The second surface and the first surface are respectively positioned on opposite sides of the base substrate; and forming at least one opening in the first light shielding layer, the opening overlapping with at least one thin film transistor in a direction perpendicular to the second surface of the base substrate to allow light to irradiate at least the active layer of the at least one thin film transistor.

For example, forming a gate drive circuit on the first surface of the base substrate, the gate drive circuit comprising the plurality of thin film transistors.

For example, the at least one thin film transistor is a top-gate type thin film transistor.

For example, the first light shielding layer is formed by an inkjet printing process.

BRIEF DESCRIPTION OF THE DRAWINGS

The embodiments of the present disclosure will be described in more detail below with reference to the accompanying drawings in order to enable those of ordinary skill in the art to more clearly understand the embodiments of the present disclosure, in which.

DETAILED DESCRIPTION

Figure 1:
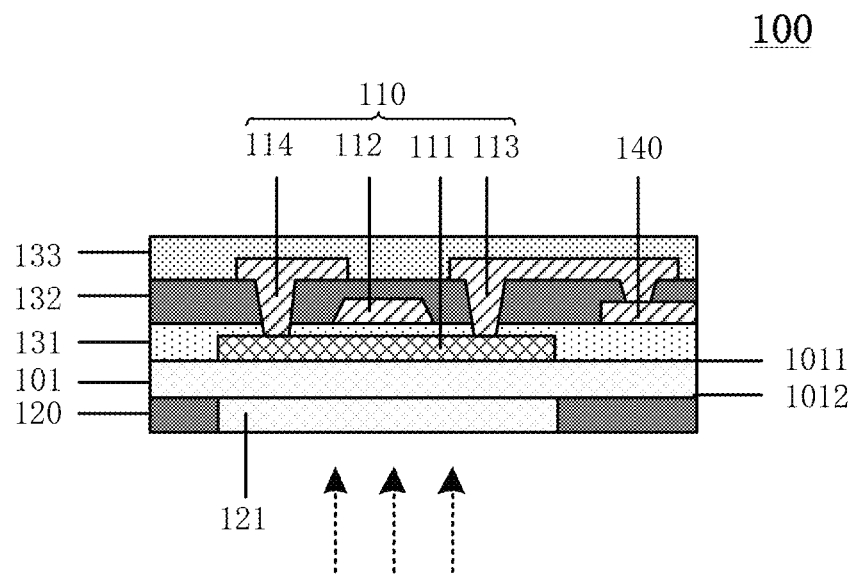
FIG. 1 is a schematic cross-sectional view of an array substrate according to an embodiment of the present disclosure.

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may also include an electrical connection/coupling, directly or indirectly. The terms, "on," "under," "left," "right," or the like are only used to indicate relative position relationship, and when the position of the object which is described is changed, the relative position relationship may be changed accordingly.

In GOA technology, the gate drive circuit is fabricated on the array substrate and usually includes a plurality of cascaded shift register units. The shift register unit usually includes a pull-down circuit for noise reduction of the pull-up node and the output terminal under the control of the level of the pull-down node. In order to realize the above noise reduction, the pull-down circuit in the shift register unit usually includes one or more thin film transistors, the gate(s) of which is/are connected to the pull-down node and is/are in a conductive state for a long time under the control of the level of the pull-down node. The above-mentioned thin film transistor(s) is/are under a forward stress for a long time, which will lead to problems, such as easy deterioration and fast deterioration speed.

Embodiments of the present disclosure provide an array substrate, a manufacturing method thereof, and a display panel. The array substrate introduces light (e.g., natural light) through an opening, and applies a negative stress to a thin film transistor under a positive stress by illumination, reducing the deterioration problem of the thin film transistor under a positive stress for a long time and helping to improve the reliability of products.

Hereinafter, embodiments of the present disclosure will be described in detail with reference to the accompanying drawings. It should be noted that the same reference numerals in different drawings will be used to refer to the same elements.

The embodiment of the present disclosure provides an array substrate, which comprises a base substrate, a thin film transistor and a first light shielding layer. The base substrate includes a first surface and a second surface respectively located on opposite sides of the base substrate. A plurality of thin film transistors are disposed on the first surface of the base substrate, and each of the plurality of thin film transistors includes an active layer. The first light shielding layer is disposed on the second surface of the base substrate. The first light shielding layer has at least one opening overlapping with at least one thin film transistor in a direction perpendicular to the second surface of the base substrate to allow light to irradiate the active layer of the at least one thin film transistor. For example, the array substrate may further include a gate drive circuit located on the array substrate, the gate drive circuit including a plurality of thin film transistors.

FIG. 1 is a schematic cross-sectional view of an array substrate according to an embodiment of the present disclosure. Referring to FIG. 1, the array substrate 100 includes a base substrate 101, a gate drive circuit and a first light shielding layer 120, and may further include structural layers, such as a first insulating layer 131, an interlayer insulating layer 132, a second insulating layer 133, and the like.

The substrate 101 acts as a support, or a protection structure, etc. For example, the base substrate may be a transparent substrate, for example, a glass substrate, a plastic substrate, a quartz substrate, or a substrate made of other suitable transparent materials. The base substrate 101 includes a first surface 1011 and a second surface 1012 located on opposite sides of the base substrate 101, respectively.

For example, the gate drive circuit includes a plurality of first thin film transistors 110 as shown in FIG. 1, which are disposed on the first surface 1011 of the base substrate 101. The first thin film transistor 110 includes a first active layer 111, a first gate electrode 112, a first source electrode 113, and a first drain electrode 114.

The first active layer 111 is disposed on the first surface 1011 of the base substrate 101 for providing a channel region. The first active layer 111 may be made of a polysilicon semiconductor material, such as a low-temperature polysilicon semiconductor material, a high-temperature polysilicon semiconductor material, or may be made of other suitable materials, such as an oxide semiconductor material, such as indium zinc oxide (IGZO), but embodiments of the present disclosure are not limited thereto. The first insulating layer 131 is disposed on the first surface 1011 of the base substrate 101 and covers the first active layer 111 to be a gate insulating layer of the first thin film transistor 110. The first insulating layer 131 may be made of silicon nitride, silicon oxide, or other suitable materials.

The first gate electrode 112 is disposed on the first insulating layer 131. The first gate electrode 112 may be made of metal, transparent conductive material or other suitable materials. The interlayer insulating layer 132 is disposed on the first insulating layer 131 and covers the first gate electrode 112. The interlayer insulating layer 132 may be made of silicon nitride, silicon oxide, or other suitable materials.

The first source electrode 113 and the first drain electrode 114 are disposed on the interlayer insulating layer 132, and are electrically connected to the first active layer 111 through vias penetrating the first insulating layer 131 and the interlayer insulating layer 132, respectively. For example, the first source electrode 113 and the first drain electrode 114 may be symmetrically disposed, so the positions of the two may be interchanged. The second insulating layer 133 is disposed on the interlayer insulating layer 132 and covers the first source electrode 113 and the first drain electrode 114. The second insulating layer 133 may be made of silicon nitride, silicon oxide, or other suitable materials.

For example, the array substrate 100 further includes gate lines 140 for pixel arrays of display regions. For example, the gate line 140 is disposed on the first insulating layer 131 and is located on the same layer as the first gate electrode 112 of the first thin film transistor 110. For example, the gate line 140 is electrically connected to the first source electrode 113 through a vias provided on the interlayer insulating layer 132. The gate lines 140 may be made of metal, transparent conductive material, or other suitable materials. For example, the first thin film transistor 110 may apply a low level signal to the gate line 140 to realize noise reduction of the output terminal of the corresponding shift register unit.

The first light shielding layer 120 is disposed on the second surface 1012 of the substrate 101, that is, the first light shielding layer 120 and the first thin film transistor 110 are disposed on opposite sides of the base substrate 101, respectively. The first light shielding layer 120 has at least one opening 121 that overlaps with the at least one first thin film transistor 110 in a direction perpendicular to the second surface 1012 of the base substrate 101 to allow light (as indicated by dashed arrows in FIG. 1) to irradiate the first active layer 111 of the at least one first thin film transistor 110. For example, the first light shielding layer 120 may be prepared by an ink jet printing process or a screen printing process, and the first light shielding layer 120 may be prepared by chromium, chromium oxide, black resin or other suitable materials.

For example, the gate drive circuit includes a plurality of cascaded shift register units including a pull-down circuit. The first thin film transistor 110 may be one thin film transistor of the pull-down circuits, and is used to maintain a conductive state for a long time to realize noise reduction. In this way, the first thin film transistor 110 is under a forward stress for a long time, and the existence of such a forward stress may result in problems, such as easy deterioration and fast deterioration speed. In this embodiment, light is irradiated onto the first active layer 111 through the opening 121, applying a negative stress due to illumination to the first thin film transistor 110 to synthesize or offset the effect of the positive stress. In this way, the deterioration problem of the first thin film transistor 110 can be reduced, the reliability of the shift register unit and the gate drive circuit can be improved, and the display effect of the display device using the gate drive circuit can be improved accordingly.

It is noted that, in the embodiment of the present disclosure, for example, the number of openings 121 may be determined according to the number of first thin film transistors 110 with serious deterioration risks. For example, in an example, when there are a plurality of first thin film transistors 110 with serious deterioration risks, a plurality of openings 121 may be provided to overlap with the plurality of first thin film transistors 110, respectively, so that light is irradiated to the respective first active layers 111 of the plurality of first thin film transistors 110. In this way, the area of the opening 121 can be reduced as much as possible, reducing the affect on the light shielding function of the first light shielding layer 120. For example, in another example, when there are a plurality of first thin film transistors 110 with serious deterioration risks and they are concentrated in a certain area of the base substrate 101, only one opening 121 may be provided and the opening 121 may overlap with the area, so that light is irradiated to the respective first active layers 111 of the plurality of first thin film transistors 110 through this same opening 121. This method can reduce the requirement for process precision and the processing difficulty.

For example, the opening 121 may have any shape, such as rectangular, square, circular, etc. For example, the size of the opening 121 may be approximately equal to the size of the first active layer 111, or may be larger or smaller than the size of the first active layer 111. For example, when the first light shielding layer 120 is sprayed on the second surface 1012 of the base substrate 101 by an ink jet printing process, the ink jet printing material is not sprayed at the position where the opening 121 needs to be provided, so that the opening 121 is formed in the first light shielding layer 120.

For example, the light irradiated onto the first active layer 111 through the opening 121 may be natural light, which can simplify the structure as much as possible while realize the corresponding functions. However, the embodiment of the present disclosure is not limited to this, and light may also be provided by another light source. For example, when the natural light intensity in the environment is low and cannot meet the light intensity requirement for applying a negative stress, light may be provided by another light source. For example, the light source may be provided separately, or the backlight may be used to provide light when the display panel including the array substrate 100 has a backlight. The backlight source can be, for example, a Light Emitting Diode (LED), which is advantageous for realizing a relatively light and thin shape and structure.

It should be noted that in the embodiment of the present disclosure, the number of the first thin film transistors 110 overlapping with the opening 121 may be one or more, and may be determined according to the circuit structure of the shift register unit. For example, the shift register unit includes a plurality of first thin film transistors 110, and the plurality of first thin film transistors 110 respectively belong to circuits having different functions in the shift register unit. The first thin film transistor 110 overlapping with the opening 121 is not limited to a transistor in a pull-down circuit of the shift register unit, but may be a transistor in another circuit of the shift register unit. For example, when the first thin film transistor 110 in other circuits of the shift register unit is greatly affected by the forward stress, it can also be illuminated through the opening 121. In this embodiment, a negative stress may be applied to any one or more first thin film transistors 110 in the shift register unit by illumination, reducing the deterioration problem thereof.

For example, in a plurality of first thin film transistors 110, part of the first thin film transistors 110 overlap with the opening 121, while other parts of the first thin film transistors 110 do not overlap with the opening 121. For example, the first thin film transistor 110 overlapping with the opening 121 is a top-gate type thin film transistor, that is, the first active layer 111 is closer to the base substrate 101 compared with the first gate electrode 112 so that light is irradiated to the first active layer 111 through the opening 121. For example, a first thin film transistor 110 that does not overlap with the opening 121 may be a top-gate type thin film transistor or a bottom-gate type thin film transistor.

Figure 2:
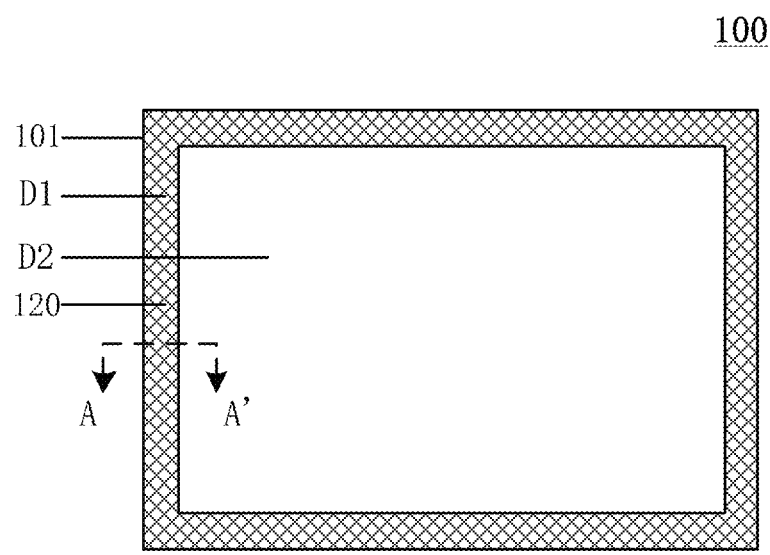
FIG. 2 is a schematic plan view of an array substrate according to an embodiment of the present disclosure.

FIG. 2 is a schematic plan view of an array substrate according to an embodiment of the present disclosure. Referring to FIG. 2, the substrate 101 includes a border region D1 and a display region D2. The gate drive circuit is located in the border region D1, and the display region D2 includes pixel regions corresponding to pixel units and other components, such as gate lines, data lines, and the like. For example, the first light shielding layer 120 is located in the border region D1 for preventing light leakage of the display screen using the array substrate 100 and avoiding obvious halo at the edge of the display screen. For example, the border region D1 is completely covered by the first light shielding layer 120 to improve the light shielding effect. At least one opening 121 (not shown in FIG. 2) is included in the border region D1 to allow light to irradiate at least one first thin film transistor 110 in the gate drive circuit located in the border region D1.

Figure 3:
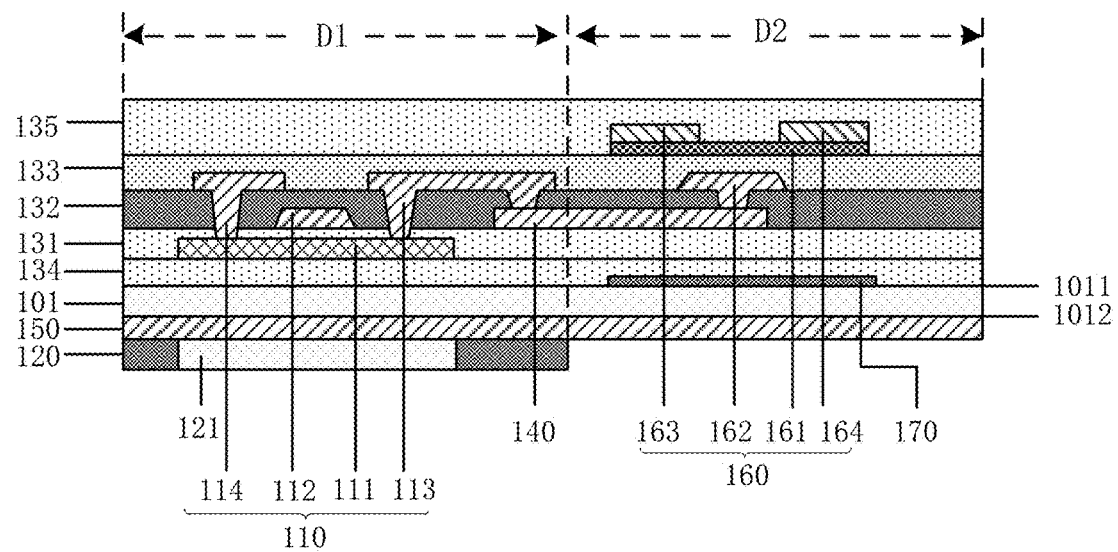
FIG. 3 is a schematic cross-sectional view of an array substrate along the direction A-A' in FIG. 2 according to an embodiment of the present disclosure.

FIG. 3 is a schematic cross-sectional view of an array substrate along the direction A-A' in FIG. 2 according to an embodiment of the present disclosure. Referring to FIG. 3, the first thin film transistor 110 and the first light shielding layer 120 are located in the border region D1, and the opening 121 enables light to be irradiated to the first active layer 111. The detailed description of the first thin film transistor 110, the first light shielding layer 120 and the opening 121 can refer to the related description of the array substrate 100 shown in FIG. 1, and will not be repeated here.

A pixel unit in the display region D2 includes a second thin film transistor 160. For example, the second thin film transistor 160 includes a second active layer 161, a second gate electrode 162, a second source electrode 163, and a second drain electrode 164. Here, the second thin film transistor 160 is a bottom-gate type thin film transistor, but embodiments of the present disclosure are not limited thereto, and the second thin film transistor 160 may be a top-gate type thin film transistor in other examples.

The second gate electrode 162 is disposed on the interlayer insulating layer 132. The second gate electrode 162 may be made of metal, transparent conductive material, or other suitable materials. The second gate electrode 162 is electrically connected to the gate line 140 through a vias provided in the interlayer insulating layer 132, so as to control the second thin film transistor 160 to be turned on or turned off according to signals transmitted from the gate line 140.

The second active layer 161 is disposed on the second insulating layer 133 for providing a channel region. The second active layer 161 may be made of an oxide semiconductor or an organic semiconductor material, such as a metal oxide semiconductor material (such as indium gallium zinc oxide (IGZO)), or a polysilicon semiconductor material, such as a low-temperature polysilicon semiconductor material, a high-temperature polysilicon semiconductor material, or the like, and the embodiments of the present disclosure are not limited thereto.

The second source electrode 163 and the second drain electrode 164 are disposed on the second insulating layer 133 and are electrically connected to the second active layer 161, respectively (for example, the second source electrode 163 and the second drain electrode 164 are disposed directly on two ends of the second active layer 161 and overlap with the two ends of the second active layer 161). For example, the second source electrode 163 and the second drain electrode 164 may be symmetrically disposed, so the positions of the two electrodes may be interchanged. The passivation layer 135 is disposed on the second insulating layer 133 and covers the second active layer 161, the second source electrode 163, and the second drain electrode 164. The passivation layer 135 may be made of silicon nitride, silicon oxide, or other suitable materials.

For example, the array substrate 100 may further include a buffer layer 134. The buffer layer 134 is disposed on the first surface 1011 of the base substrate 101 and is located between the base substrate 101 and the first active layer 111 of the first thin film transistor 110. For example, the buffer layer 134 is made of a transparent material so that light passes through the buffer layer 134 to irradiate the first active layer 111. The buffer layer 134 can prevent impurity ions in the substrate 101 from diffusing into the circuit layer including the first thin film transistor 110 and the second thin film transistor 160 formed later, and prevent effects on characteristics, such as threshold voltage and leakage current of the first thin film transistor 110 and the second thin film transistor 160. In addition, the buffer layer 134 may also planarize the first surface 1011 of the base substrate 101. The buffer layer 134 may be formed by silicon nitride, silicon oxide, or other suitable materials.

For example, the buffer layer 134 may be omitted according to requirements, or disposed at other locations according to requirements.

For example, the array substrate 100 may further include a second light shielding layer 170. The second light shielding layer 170 is disposed on the first surface 1011 of the substrate 101, covered by the buffer layer 134, and is located between the substrate 101 and the active layer of the thin film transistor that does not overlap with the opening 121, for example, between the substrate 101 and the second active layer 161 of the second thin film transistor 160. It is noted that in the embodiment of the present disclosure, the thin film transistors that do not overlap with the opening 121 may be thin film transistors disposed at any position on the substrate 101, the second light shielding layer 170 is disposed between the active layer of the thin film transistors and the substrate 101, and the thin film transistors may be top-gate type or bottom-gate type thin film transistors. For example, a gate drive circuit including a plurality of first thin film transistors 110 is provided in the border region D1. Part of the first thin film transistors 110 overlap with the opening 121 while other parts of the first thin film transistors 110 do not overlap with the opening 121. In this way, the second light shielding layer 170 may be provided between the first active layer 111 of the other parts of the first thin film transistors 110 that do not overlap with the opening 121 and the substrate 101. The second light shielding layer 170 may also be disposed between any thin film transistor in the pixel units in the display region D2 and the substrate 101.

The second light shielding layer 170 can prevent an active layer (e.g., polysilicon, amorphous silicon, or oxide semiconductor, etc.) in a thin film transistor formed thereon from being irradiated by strong light from the back side (lower side in FIG. 3) of the base substrate 101 to generate photo-generated carriers, resulting in the degradation of its switching performance. For example, a metal or metal oxide material or the like may be used to prepare the second light shielding layer 170. For example, the second light shielding layer 170 may be omitted according to requirements or disposed at other positions according to requirements, and embodiments of the present disclosure are not limited thereto.

For example, in the case where the array substrate 100 is used in a liquid crystal display panel or the like, the array substrate 100 may further include a polarizer 150. The polarizer 150 is disposed on the second surface 1012 of the substrate 101 and is located between the substrate 101 and the first light shielding layer 120. The polarizer 150 has a polarization direction along a direction, and when, for example, natural light passes through the polarizer 150, a polarized light polarized along that direction is obtained. For example, the polarizer 150 may be a polyvinyl alcohol (PVA) film prepared by a stretching process or a wire grid obtained by a patterning process, and embodiments of the present disclosure are not limited thereto. For example, the polarizer 150 may be omitted according to requirements or disposed at other positions according to requirements, and embodiments of the present disclosure are not limited thereto.

It is noted that in the embodiment of the present disclosure, the array substrate 100 may further include more or fewer components, and the relative positional relationship of each component can enable light to irradiate the active layer of at least one thin film transistor (e.g., the first active layer 111 of at least one first thin film transistor 110), reducing the deterioration problem of the at least one thin film transistor due to forward stress and further improving the reliability of the product.

Figure 4:
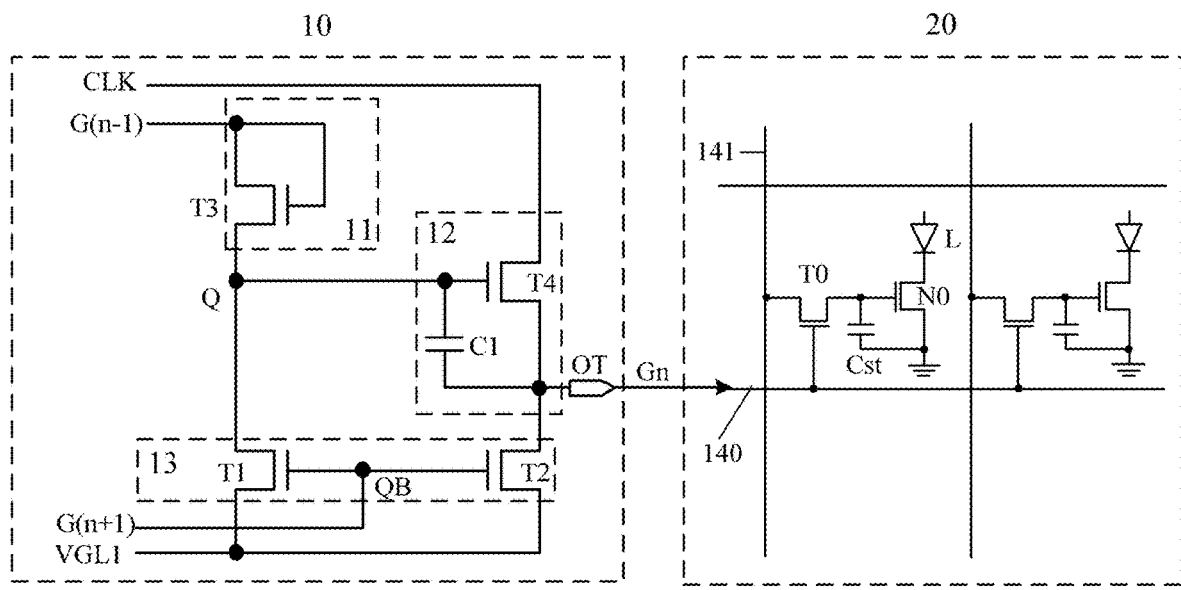
FIG. 4 is a circuit diagram of an example of a shift register unit of a gate drive circuit.

FIG. 4 is an example circuit diagram of a shift register unit of a gate drive circuit. Referring to FIG. 4, the shift register unit 10 and the pixel circuit 20 are disposed together on the base substrate 101. A plurality of gate lines 140 and a plurality of data lines 141 are arranged in an array and intersected with each other to define a plurality of pixel units, each pixel unit comprises at least a basic 2T1C circuit, that is, two transistors T0, N0 and a storage capacitor Cst are utilized to realize the basic function of driving the light emitting element L to emit light. The switching transistor T0 is a switching element connected to the gate line 140 and the data line 141, respectively. For example, the switching transistor T0 is a second thin film transistor 160 as shown in FIG. 3. The switching transistor T0 applies data signals supplied from the data line 141 to the storage capacitor Cst to charge under the control of the gate scan signals supplied from the gate line 140, so as to control the light emitting element L to emit light through the driving transistor N0. For example, the gate drive circuit includes a plurality of cascaded shift register units 10. Each shift register unit 10 includes an input circuit 11, an output circuit 12, a pull-up node Q, a pull-down node QB, and a pull-down circuit 13. The input circuit 11 is configured to charge the pull-up node Q in response to an input signal, for example, the gate scan signal G(n−1) output by the shift register unit 10 of the previous stage. The output circuit 12 is configured to output the clock signal CLK to the output terminal OT under the control of the level of the pull-up node Q. The pull-down circuit 13 is configured to de-noise the pull-up node Q and the output OT under the control of the level of the pull-down node QB.

The pull-down circuit 13 may be implemented as a first transistor T1 and a second transistor T2. The gate electrode of the first transistor T1 is configured to be connected to the pull-down node QB, the first pole of the first transistor T1 is configured to be connected to the pull-up node Q, and the second pole of the first transistor T1 is configured to be connected to the first voltage terminal VGL1 to receive the first voltage. The gate electrode of the second transistor T2 is configured to be connected to the pull-down node QB, the first pole of the second transistor T2 is configured to be connected to the output terminal OT, and the second pole of the second transistor T2 is configured to be connected to the first voltage terminal VGL1 to receive the first voltage.

The input circuit 11 may be implemented as a third transistor T3. The first pole of the third transistor T3 is connected to the gate electrode and receives the gate scan signal g (n−1) output from the shift register unit 10 of the previous stage, i.e., the n−1st stage, as an input signal (a trigger signal), the second pole of the third transistor T3 is connected to the pull-up node Q, so that the pull-up node Q can be charged when the third transistor T3 is turned on.

The output circuit 12 may be implemented as a fourth transistor T4 and a first capacitor C1. The gate electrode of the fourth transistor T4 is connected to the pull-up node Q, the first pole of the fourth transistor T4 receives the clock signal CLK, and the second pole of the fourth transistor T4 is connected to the output terminal OT. The fourth transistor T4 can output a gate scan signal Gn (this signal is a square wave pulse signal, and accordingly the pulse portion is at the 'ON' level and the non-pulse portion is at the 'OFF' level), and a trigger signal for the shift register unit 10 of the next stage. The first pole of the first capacitor C1 is connected to the gate electrode of the fourth transistor T4, and the second pole of the first capacitor C1 is connected to the second pole of the fourth transistor T4. The fourth transistor T4 is turned on under the control of the level of the pull-up node Q, so that the clock signal CLK is output through the output terminal OT. The first capacitor C1 may store the level of the pull-up node Q, and may continue to pull up the level of the pull-up node Q through its own bootstrap effect to improve the output performance when the fourth transistor T4 is turned on for output.

The pull-down node QB is connected to the output of the shift register unit 10 of the next stage, i.e., the n+1st stage, to receive the gate scan signal G(n+1) to control the level of the pull-down node QB. Under the control of the level of the pull-down node QB, the first transistor T1 and the second transistor T2 are turned on, so that the output signal of the output terminal OT is pulled down to a low level when it is not necessary to output the gate scan signal Gn, and the pull-up node Q is pulled down to a low level to turn off the fourth transistor T4.

In operation, when the gate scan signal G(n−1) is at a high level, the third transistor T3 is turned on and charges the pull-up node Q. The rise in the level of the pull-up node Q turns on the fourth transistor T4, so the clock signal CLK can be output at the output terminal OT through the fourth transistor T4, that is, the gate scan signal Gn is equal to the clock signal CLK. When the clock signal CLK is high, the gate scan signal Gn is also high. When the gate scan signal Gn is at a high level, the shift register unit 10 of this stage inputs the high level signal Gn to the gate line 140 of the corresponding row to turn on the switching transistors T0 in all pixel units corresponding to the row gate line 140, and the data signal is input to the storage capacitance Cst of the corresponding pixel unit through the switching transistors T0 in each pixel unit to charge the storage capacitance Cst in the corresponding pixel unit, writing the signal voltage to each pixel unit. When the gate scan signal G(n+1) is at a high level, the first transistor T1 and the second transistor T2 are turned on to pull up the pull-up node Q and the output terminal OT to a low level. In this way, by a plurality of cascaded shift register units 10, for example, a line-by-line scanning for pixel units arranged in a plurality of rows can be realized.

For example, in this embodiment, the second transistor T2 corresponds to the first thin film transistor 110 shown in FIG. 1 and FIG. 3, although either pole of the first transistor T1 is not connected to the gate line 140, it may also correspond to the first thin film transistor 110 shown in FIG. 1 and FIG. 3. Moreover, light can be irradiated to the active layers of the first transistor T1 and the second transistor T2 through the opening 121. For example, in a case where the shift register unit 10 further includes a pull-down control circuit (not shown in the figure), the first transistor T1 and the second transistor T2 are in a conductive state for a long time under the control of the pull-down node QB, so that the noise reduction is performed on the pull-up node Q and the output terminal OT. The first transistor T1 and the second transistor T2 are under a forward stress for a long period of time, and thus are easily deteriorated. However, light (e.g., natural light) is introduced through the opening 121, and a negative stress is applied to the first transistor T1 and the second transistor T2 by the light to synthesize or offset the effect of the positive stress, so that the deterioration problem of the first transistor T1 and the second transistor T2 can be weakened, and the reliability of the product can be improved.

Figure 5:
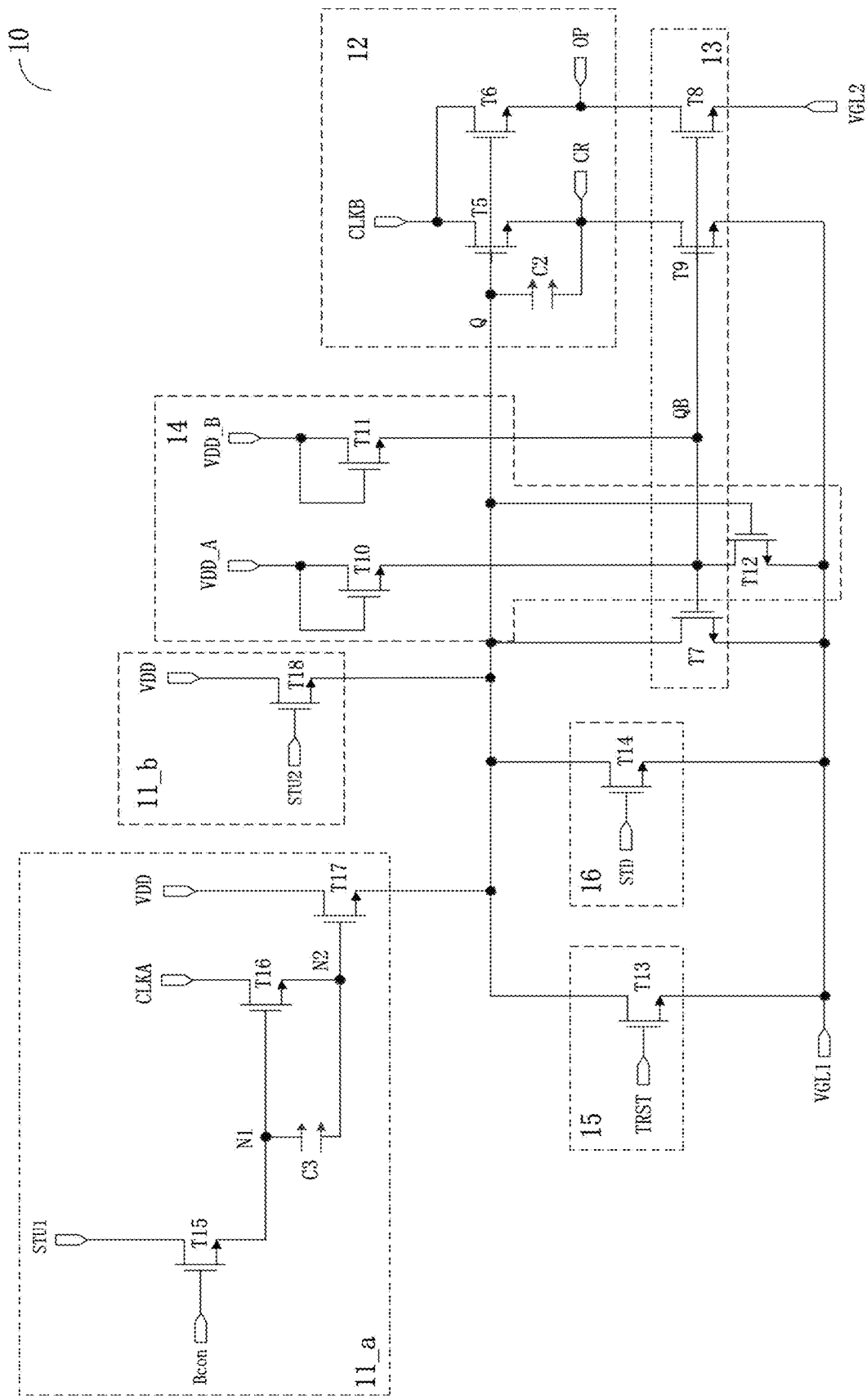
FIG. 5 is a circuit diagram of another example of a shift register unit of a gate drive circuit.

FIG. 5 is a circuit diagram of another example of a shift register unit of a gate drive circuit. Referring to FIG. 5, the shift register unit 10 includes a blanking input circuit 11_a, a display input circuit 11_b, an output circuit 12, a pull-up node Q, a pull-down node QB, a pull-down circuit 13, a pull-down control circuit 14, a blanking reset circuit 15, and a display reset circuit 16.

The blanking input circuit 11_a is configured to input a blanking pull-up signal to the pull-up node Q in a blanking period according to the blanking input signal and the blanking control signal. The display input circuit 11_b is configured to input a display pull-up signal to the pull-up node Q in a display period in response to the display input signal. The output circuit 12 is configured to output a mixed output signal to the output terminal under the control of the level of the pull-up node Q. For example, the output terminal includes a trigger signal output terminal CR and a pixel scanning signal output terminal OP. The pull-down circuit 13 is configured to de-noise the pull-up node Q and the output terminal under the control of the level of the pull-down node QB. The pull-down control circuit 14 is configured to control the level of the pull-down node QB under the control of the level of the pull-up node Q. The blanking reset circuit 15 is configured to reset the pull-up node Q in response to a blanking reset signal. The display reset circuit 16 is configured to reset the pull-up node Q in response to a display reset signal.

For example, the shift register unit 10 may be implemented as fifth to eighteenth transistors T5-T18, a second capacitor C2, and a third capacitor C3. The seventh transistor T7, the eighth transistor T8, and the ninth transistor T9 are turned on under the control of the level of the pull-down node QB, and de-noise the pull-up node Q, the pixel scan signal output OP, and the trigger signal output CR, respectively. The gate electrodes of the seventh transistor T7, the eighth transistor T8, and the ninth transistor T9 are under positive pressure, for example, 99% of the time in a frame, while the first pole and the second pole are under a negative pressure. Therefore, the above three transistors are under a forward stress for a long time, and their threshold voltage drift is significantly faster than other transistors in the shift register unit 10.

For example, the eighth transistor T8 corresponds to the first thin film transistor 110 shown in FIG. 1 and FIG. 3, although either pole of the seventh transistor T7 and the ninth transistor T9 is not connected to the gate line 140, it may also correspond to the first thin film transistor 110 shown in FIG. 1 and FIG. 3. Moreover, light rays can be irradiated to the active layers of the seventh transistor T7, the eighth transistor T8, and the ninth transistor T9 through the opening 121. Since the seventh transistor T7, the eighth transistor T8, and the ninth transistor T9 are under a forward stress, respectively, for a long time, light (e.g., natural light) is introduced through the opening 121, and a negative stress is applied to each of the seventh transistor T7, the eighth transistor T8, and the ninth transistor T9 by light to synthesize or offset the effect of the forward stresses, the deterioration problems of the seventh transistor T7, the eighth transistor T8, and the ninth transistor T9 can be reduced, and the reliability of the product can be improved.

It is noted that in the embodiment of the present disclosure, the thin film transistor overlapping with the opening 121 may not be limited to the first transistor T1, the second transistor T2 shown in FIG. 4, the seventh transistor T7, the eighth transistor T8, and the ninth transistor T9 shown in FIG. 5, it/they may be other transistors in the shift register unit 10, and the embodiment of the present disclosure is not limited thereto. The opening 121 may overlap with any transistor requiring illumination in the shift register unit 10 to introduce light, reducing its deterioration problem due to a forward stress.

It is noted that in the embodiment of the present disclosure, the structure of the shift register unit 10 is not limited to the circuit structure described above, and it may be any suitable circuit structure, and it may also include more or less transistors and/or capacitors.

It is noted that the source electrode and drain electrode of the transistor used in the embodiment of the present disclosure may be symmetrical in structure, so the source electrode and drain electrode thereof may be structurally not different. In the embodiment of the present disclosure, in order to distinguish the two poles of the transistor except the gate electrode, one pole is directly described as the first pole and the other pole is described as the second pole.

In addition, the transistors in the embodiments of the present disclosure are all described as N-type transistors as examples, in which the first electrode of the transistor is a drain electrode and the second electrode is a source electrode, while it should be noted that this disclosure includes but is not limited thereto. For example, one or more transistors in the embodiment of the present disclosure may also adopt a P-type transistor, in which the first electrode of the transistor is a source electrode and the second electrode is a drain electrode, and each electrode of the transistor of the selected type is correspondingly connected with each electrode of the corresponding transistor in the embodiment of the present disclosure, and the corresponding voltage terminal is provided with a corresponding high voltage or a corresponding low voltage.

The embodiment of the present disclosure also provides a display panel including the array substrate described in any embodiment. The display panel introduces light (such as natural light) by arranging an opening, and applies a negative stress to the thin film transistor under the positive stress by utilizing the light, weakening the deterioration problem of the thin film transistor under the positive stress for a long time, and contributing to improving the reliability of products.

Figure 6:
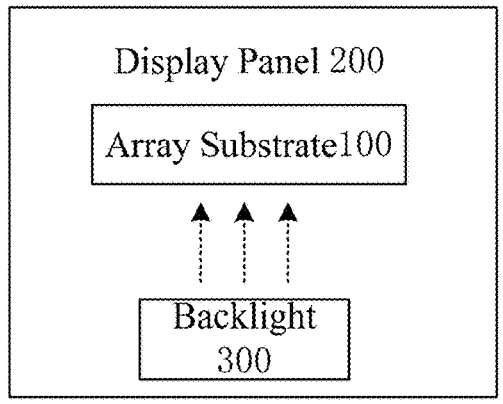
FIG. 6 is a schematic block diagram of a display panel according to an embodiment of the present disclosure.

FIG. 6 is a schematic block diagram of a display panel according to an embodiment of the present disclosure. Referring to FIG. 6, the display panel 200 includes an array substrate 100, which is an array substrate according to any embodiment of the present disclosure. For example, the display panel 200 may be an OLED display panel, a liquid crystal display panel, or the like. For example, the display panel 200 may be applied to any product or component having a display function, such as a display, a mobile phone, a tablet computer, a notebook computer, an electronic book, a game machine, a television, a digital photo frame, a navigator, etc. The technical effect of the display panel 200 can refer to the above description of the array substrate 100, which is not repeated here.

For example, in an example, the display panel 200 further includes a backlight 300. The light emitted from the backlight 300 may be irradiated to the first active layer 111 of the at least one first thin film transistor 110 through the opening 121. For example, when the natural light intensity in the environment is low and cannot meet the light intensity requirement of applying a negative stress, the backlight 300 may provide light so that the light satisfying the light intensity requirement is irradiated to the first active layer 111 of the first thin film transistor 110 under the positive stress. The setting position of the backlight 300 in the display panel 200 is not limited and may be determined according to requirements. For example, the backlight 300 may be any form of a linear light source, a point light source or a surface light source, or may be a common light source or a polarized light source, but embodiments of the present disclosure are not limited thereto.

At least one embodiment of the present disclosure also provides a manufacturing method of the array substrate, which can prepare the array substrate described in any embodiment of the present disclosure. The array substrate manufactured by the method can apply a negative stress to the thin film transistor under the positive stress by illumination, weakening the deterioration problem of the thin film transistor under the positive stress for a long time and being beneficial to improving the reliability of products.

Figure 7:
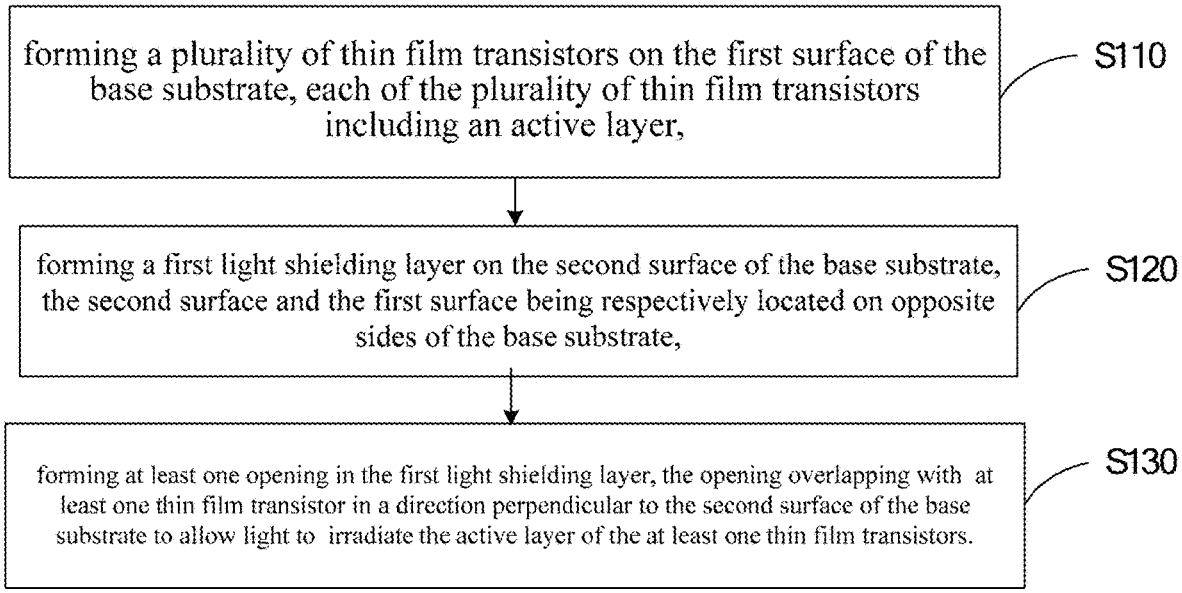
FIG. 7 is a flow chart of a manufacturing method of an array substrate according to an embodiment of the disclosure.

FIG. 7 is a flow chart of a manufacturing method of an array substrate according to an embodiment of the disclosure. For example, in an example, referring to FIG. 7, the manufacturing method of the array substrate includes the following operations.

Step S110: Forming a plurality of thin film transistors each including an active layer on a first surface of a base substrate;

Step S120: A first light shielding layer is formed on the second surface of the substrate, and the second surface and the first surface are respectively located on opposite sides of the substrate.

Step S130: At least one opening is formed in the first light shielding layer, which overlaps with at least one thin film transistor in a direction perpendicular to the second surface of the base substrate to allow light to irradiate the active layer of the at least one thin film transistor.

For example, the step of forming a gate drive circuit including the plurality of thin film transistors may also be included.

For example, at least one thin film transistor overlapping with the opening is a top-gate type thin film transistor so that light rays can be irradiated to the active layer of the thin film transistor through the opening.

For example, the first light shielding layer is formed by an ink jet printing process or a screen printing process. For example, when the first light shielding layer is sprayed on the second surface of the base substrate by the ink jet printing process, the ink jet printing material is not sprayed at the position where the opening needs to be set, so that the opening can be made in the first light shielding layer, but the embodiment of the present disclosure is not limited thereto.

It should be noted that in the embodiment of the present disclosure, the manufacturing method of the array substrate is not limited to the steps and sequences described above, it may also include more or fewer steps, and the sequences between the various steps may be determined according to requirements. The technical effect of the manufacturing method of the array substrate can be referred to the above description of the array substrate 100, which is not repeated here.

The following points is noted:

(1) The accompanying drawings of the embodiments of the present disclosure only involve structures relevant to the embodiments of the present disclosure, and other structures may refer to a common design.

(2) Without conflict with each other, the embodiments of the present disclosure and the characteristics in the embodiments may be combined to obtain new embodiments.

The foregoing is only the exemplary embodiments of the present disclosure, and the scope of the present disclosure is not limited thereto. A person of ordinary skill in the art can make various changes and modifications without departing from the spirit of the present disclosure, and such changes and modifications shall fall into the scope of the present disclosure.

What is claimed is:

1. An array substrate comprising:
a base substrate comprising a first surface and a second surface respectively at opposite sides of the base substrate;
a gate drive circuit on the first surface of the base substrate, the gate drive circuit comprising a plurality of thin film transistors, each of the plurality of thin film transistors comprising an active layer, and
a first light shielding layer provided on the second surface of the base substrate, wherein the first light shielding layer has at least one opening that overlaps with at least one thin film transistor in a direction perpendicular to the second surface of the base substrate to allow light to irradiate an active layer of at least one thin film transistor,
wherein the Late drive circuit further comprises a plurality of cascaded shift register units, each of which comprises an input circuit, an output circuit, a pull-up node, a pull-down node, and a pull-down circuit, the input circuit being configured to charge the pull-up node in response to an input signal, the output circuit being configured to output a clock signal to an output terminal under the control of a level of the pull-up node, and the pull-down circuit being configured to de-noise the pull-up node and the output terminal under the control of a level of the pull-down node, wherein the pull-down circuit comprises a first transistor and a second transistor,
a gate electrode of the first transistor is configured to be connected to the pull-down node, a first pole of the first transistor is configured to be connected to the pull-up node, and a second pole of the first transistor is configured to be connected to a first voltage terminal to receive a first voltage, a gate electrode of the second transistor is configured to be connected to the pull-down node, a first pole of the second transistor is configured to be connected to the output terminal, and a second pole of the second transistor is configured to be connected to the first voltage terminal to receive the first voltage, and
the at least one opening overlapping with the first transistor and the second transistor in the direction perpendicular to the second surface of the base substrate to allow light to irradiate at least active layers of the first transistor and the second transistor.

2. The array substrate according to claim 1, wherein the base substrate comprises a border region, and the gate drive circuit and the first light shielding layer are provided in the border region.

3. The array substrate according to claim 1, wherein the at least one thin film transistor is a top-gate type thin film transistor.

4. The array substrate according to claim 1, further comprising:
a second light shielding layer, wherein the second light shielding layer is provided on the first surface of the base substrate and is between the base substrate and active layers of thin film transistors that do not overlap with the at least one opening.

5. The array substrate according to claim 1, wherein the base substrate is a transparent substrate.

6. The array substrate according to claim 1, further comprising a buffer layer, wherein the buffer layer is provided on the first surface of the base substrate and between the base substrate and the active layer of the at least one thin film transistor.

7. The array substrate according to claim 6, wherein the buffer layer is made of transparent material.

8. The array substrate according to claim 1, further comprising a polarizer, wherein the polarizer is arranged on the second surface of the base substrate and is provided between the base substrate and the first light shielding layer.

9. The array substrate according to claim 1, wherein a material of the first light shielding layer is selected from the group consisting of chromium, chromium oxide, and black resin.

10. A display panel comprising an array substrate, wherein the array substrate comprises:
a base substrate comprising a first surface and a second surface respectively at opposite sides of the base substrate;
a gate drive circuit on the first surface of the base substrate, the gate drive circuit comprising a plurality of thin film transistors, each of the plurality of thin film transistors comprising an active layer; and
a first light shielding layer provided on the second surface of the base substrate, wherein the first light shielding layer has at least one opening that overlaps with at least one thin film transistor in a direction perpendicular to the second surface of the base substrate to allow light to irradiate an active layer of the at least one thin film transistor,
wherein the gate drive circuit further comprises a plurality of cascaded shift register units, each of which comprises an input circuit, an output circuit, a pull-up node, a pull-down node, and a pull-down circuit, the input circuit being configured to charge the pull-up node in response to an input signal, the output circuit being configured to output a clock signal to an output terminal under the control of a level of the pull-up node, and the pull-down circuit being configured to de-noise the pull-up node and the output terminal under the control of a level of the pull-down node, wherein the pull-down circuit comprises a first transistor and a second transistor,
a gate electrode of the first transistor is configured to be connected to the pull-down node, a first pole of the first transistor is configured to be connected to the pull-up node, and a second pole of the first transistor is configured to be connected to a first voltage terminal to receive a first voltage,
a gate electrode of the second transistor is configured to be connected to the pull-down node, a first pole of the second transistor is configured to be connected to the output terminal, and a second pole of the second transistor is configured to be connected to the first voltage terminal to receive the first voltage, and
the at least one opening overlapping with the first transistor and the second transistor in the direction perpendicular to the second surface of the base substrate to allow light to irradiate at least active layers of the first transistor and the second transistor.

11. The display panel according to claim 10, further comprising a backlight source, wherein light emitted from the backlight source is irradiated to the active layer of the at least one thin film transistor through the at least one opening.

12. The display panel according to claim 10, further comprising:
a second light shielding layer, wherein the second light shielding layer is provided on the first surface of the base substrate and is between the base substrate and active layers of thin film transistors that do not overlap with the at least one opening.

13. A manufacturing method of an array substrate, comprising:
providing a base substrate comprising a first surface and a second surface respectively at opposite sides of the base substrate,
forming a gate drive circuit on the first surface of the base substrate, the gate drive circuit comprising a plurality of thin film transistors, each of the plurality of thin film transistors including an active layer;
forming a first light shielding layer on the second surface of the base substrate; and
forming at least one opening in the first light shielding layer, the at least one opening overlapping with at least one thin film transistor in a direction perpendicular to the second surface of the base substrate to allow light to irradiate at least an active layer of the at least one thin film transistor,
wherein the gate drive circuit further comprises a plurality of cascaded shift register units, each of which comprises an input circuit, an output circuit, a pull-up node, a pull-down node, and a pull-down circuit, the input circuit being configured to charge the pull-up node in response to an input signal, the output circuit being configured to output a clock signal to an output terminal under the control of a level of the pull-up node and the pull-down circuit being configured to de-noise the pull-up node and the output terminal under the control of a level of the pull-down node, and
wherein the pull-down circuit comprises a first transistor and a second transistor, a gate electrode of the first transistor is configured to be connected to the pull-down node a first pole of the first transistor is configured to be connected to the pull-up node, and a second pole of the first transistor is configured to be connected to a first voltage terminal to receive a first voltage, a gate electrode of the second transistor is configured to be connected to the pull-down node, a first pole of the second transistor is configured to be connected to the output terminal, and a second pole of the second transistor is configured to be connected to the first voltage terminal to receive the first voltage, and the at least one opening overlapping with the first transistor and the second transistor in the direction perpendicular to the second surface of the base substrate to allow light to irradiate at least active layers of the first transistor and the second transistor.

14. The manufacturing method of the array substrate according to claim 13, wherein the at least one thin film transistor is a top-gate type thin film transistor.

15. The manufacturing method of the array substrate according to claim 13, wherein the first light shielding layer is formed by an inkjet printing process.

16. The manufacturing method of the array substrate according to claim 13, further comprising:

forming a second light shielding layer on the first surface of the base substrate and between the base substrate and active layers of thin film transistors that do not overlap with the at least one opening.

\* \* \* \* \*

UNITED STATES PATENT AND TRADEMARK OFFICE
CERTIFICATE OF CORRECTION

PATENT NO. : 10,998,446 B2
APPLICATION NO. : 16/395444
DATED : May 4, 2021
INVENTOR(S) : Feng et al.

Page 1 of 1

It is certified that error appears in the above-identified patent and that said Letters Patent is hereby corrected as shown below:

In the Claims

Column 14, Claim 1, Line 49:
Delete "Late" and insert --gate--

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*